United States Patent [19]

Segerson

[11] 3,860,397

[45] Jan. 14, 1975

[54] LEAD FRAME

[75] Inventor: Eugene E. Segerson, Tempe, Ariz.

[73] Assignee: Motorola, Inc., Franklin Park, Ill.

[22] Filed: Sept. 11, 1970

[21] Appl. No.: 71,369

Related U.S. Application Data

[62] Division of Ser. No. 722,471, April 18, 1968, Pat. No. 3,560,808.

[52] U.S. Cl. .......................... 29/191.6, 174/52 PE

[51] Int. Cl. .......................................... B32b 15/00

[58] Field of Search ............. 29/180 S, 180 SS, 183, 29/183.5, 191, 191.6, 193.5; 174/52 PE, 52 S, 56

[56] References Cited

UNITED STATES PATENTS

| | | | |
|---|---|---|---|
| 2,154,597 | 4/1939 | Barrett | 29/180 SS U X |
| 3,248,184 | 4/1966 | Osbornjh et al. | 29/183 |
| 3,279,043 | 10/1966 | Wirt | 29/183.5 X |
| 3,440,027 | 4/1969 | Hugle | 29/193.5 |
| 3,469,017 | 9/1969 | Starger | 174/52 S |
| 3,484,533 | 12/1969 | Kauffman | 29/193.5 X |
| 3,544,857 | 12/1970 | Byrne et al. | 174/52 S X |
| 3,549,782 | 12/1970 | Reifel | 174/52 PE |

*Primary Examiner*—A. B. Curtis
*Attorney, Agent, or Firm*—Mueller, Aichele & Ptak

[57] ABSTRACT

A plastic encapsulated, high-frequency power transistor assembly having a metallized ceramic base and a metallic heat sink is fabricated by a method which includes the use of a thin, substantially flat lead frame member having at least four inwardly projecting, substantially coplanar electroconductive leads and a bridging portion integral therewith connecting the ends of two of said leads. The lead ends are bonded to corresponding metallized areas of the ceramic base, one of said metallized areas having a centrally extended configuration adapted for die bonding of the seimiconductor unit. The assembly is then completed by the attachment of a metallic stud to the opposite side of the ceramic base, wire bonding of the emitter region to the bridging portion of the lead frame, wire bonding of the base region to the remaining lead, and a final step of plastic encapsulation.

7 Claims, 5 Drawing Figures

LEAD FRAME

This is a division of application Ser. No. 722,471, filed Apr. 18, 1968, which issued Feb. 2, 1971, now U.S. Pat. No. 3,560,808 and is related to another divisional application from said parent application, which said divisional application was filed Sept. 21, 1970 as Ser. No. 74,104 and will issue on Mar. 6, 1973 as U.S. Pat. No. 3,718,969.

The present application is related in a general sense in the lead frame art with patents owned by applicant's assignee, U.S. Pat. No. 3,611,061 issued Oct. 5, 1971, and U.S. Pat. No. 3,698,073 issued Oct. 17, 1972.

BACKGROUND

This invention relates to the fabrication of packaged semiconductor assemblies, and more particularly to the assembly of a plastic encapsulated, high-frequency power transistor device with the use of a thin, substantially flat lead frame member having a particular geometric configuration.

Transistors used in the VHF-UHF frequency range are commonly fabricated with a structure wherein the collector region forms the major portion of the transistor. The base and emitter regions are relatively small and are formed in the top surface of the collector portion. To remove the heat generated in the transistor, a thermal path of high conductivity is provided from the transistor to an external heat sink. This thermal path includes the major portions of the mounting structure containing the transistor, and since the collector is the major heat generating portion of the transistor, the collector is thermally and electrically connected to the thermal path.

In transistor amplifier circuits it is important that the impedance of the common electrode be minimized in order to prevent degeneration and the attendant loss of current gain in the amplifying stage. The most typical amplifier circuit utilizes the common emitter configuration. Accordingly, it is necessary to provide an emitter electrode connection capable of minimizing inductance and optimizing current gain. For example, it is known to provide multiple wires connecting the emitter region to external leads. It is also desirable to provide the shortest possible distance between the emitter region and the point of wire connection to external leads, and to provide equal lengths for the multiple wire leads.

THE INVENTION

It is an object of the invention to provide an improved semiconductor package assembly that is particularly suited for a high-frequency power transistor. It is also an object of the invention to provide an improved method for the assembly of such a device. It is a more particular object of the invention to provide an improved lead frame for use in the construction of a semiconductor package assembly.

A primary feature of the invention lies in the particular configuration of the lead frame, which includes a thin, substantially flat electroconductive structure having at least four inwardly projecting coplanar lead portions and a bridging portion integral therewith connecting the ends of two of said lead portions. The two lead portions connected by the bridging portion preferably extend in opposite directions along a collinear central axis. The bridging portion is preferably narrower than the lead portions and is advantageously offset from the central axis of the lead portions in order to provide more suitable spacing for locating the semiconductor unit. The bridging portion necessarily includes a section that is displaced somewhat from the plane of the remainder of the lead frame, in order to provide clearance between the bridging portion and the metallized area of the ceramic base on which the semiconductor unit is mounted, as will be apparent from the more detailed description of the invention to follow.

One aspect of the invention is embodied in a lead frame for use in the assembly of a semiconductor device, comprising a thin, substantially flat sheet of electroconductive material which includes at least four inwardly projecting, substantially coplanar lead portions and a bridging portion integral therewith connecting the ends of two of said lead portions. When semiautomatic or fully automated mass production techniques are employed, the lead frame preferably consists of an elongated strip of electroconductive material having a plurality of identical sections each of which includes the above configuration.

In a particular embodiment of the lead frame of the invention, each of four lead portions projects inwardly at an angle of approximately 90° with respect to adjacent lead portions, while the bridging portion connects the ends of two lead portions projecting inwardly at an angle of 180° with respect to each other. The width of the bridging portion is substantially less of that of the lead portions in order to facilitate access to the underlying metallized area of the ceramic base during the die-bonding operation. The bridging portion is offset from the central axis of the lead portions, and also includes a section which is substantially displaced from, i.e., noncoplanar with, the remainder of the lead frame in order to provide clearance with respect to the metallized area of the ceramic base which serves as the collector contact for the transistor unit.

Another aspect of the invention is embodied in a packaged semiconductor device comprising a metallized ceramic base, at least four electroconductive leads attached to separate metallized areas on one side of the base, a semiconductor unit bonded to a metallized area of the base, an electroconductive bridging portion integral with the ends of two of the leads, and means for connecting the electrodes of the semiconductor element with corresponding electroconductive leads, including a plurality of connections to the bridging portion.

The combination is particularly attractive for the packaging of a high-frequency power transistor, as a means of optimizing current gain and minimizing emitter electrode inductance. These advantages are obtained, for example, by connecting the emitter region of the transistor to the bridging portion of the lead frame by means of a plurality of wires of equal length. The device preferably includes a metallic stud or other heat sink member bonded to the opposite side of the ceramic base. The metallized area of the base which serves as a collector contact for the semiconductor device extends from a central area of the base toward the perimeter thereof where it is attached to the corresponding external lead. The bridging portion of the lead frame facilitates the use of wires of equal lengths in providing the emitter connection, while at the same time providing two external leads for the emitter region in order to accommodate the common emitter connection into amplifier circuits.

An additional aspect of the invention is embodied in a method for the assembly of a semiconductor device, beginning with the step of providing a thin, substantially flat lead frame having at least four inwardly projecting, substantially coplanar, electroconductive lead portions and a bridging portion integral therewith connecting the ends of two of the lead portions. A metallized ceramic base is then provided having at least four separate metallization areas on one side thereof, arranged to register with the ends of corresponding lead portions. The metallized areas of the base are then bonded to the corresponding ends of the lead portions, followed by die bonding of the semiconductor unit to one of the metallized areas. In the case of a transistor unit, the base and emitter electrodes are wire bonded to the corresponding lead portions. Specifically, the emitter electrode is wire bonded to the bridging portion which connects the ends to two opposing lead portions, and the base region is wire bonded to its corresponding lead portion. The metallized area on which the semiconductor unit is bonded serves as the collector contact and extends to the perimeter of the base of where it is bonded to the corresponding external collector lead.

An essential step in the process involves the shaping of the bridging portion to include a section which is non-coplanar with the remaining lead portions in order to provide clearance between the bridging portion and the metallized area on which the semiconductor unit is mounted.

After die bonding and wire bonding, the composite structure is prepared for a final encapsulation step by precoating with a suitable composition, such as silicone resin, for example, to protect the wire bonds during the molding operation. An additional feature of the lead frame configuration, particularly adapted to improve the strength of the molded product, is the location of one or more apertures in the lead portions just outside the perimeter of the ceramic base. The plastic fills these apertures during the molding operation to provide a small amount of plastic connecting the upper and lower portions of the molded body on opposite sides of the ceramic base, thereby improving its strength.

THE DRAWING

Figure 1:
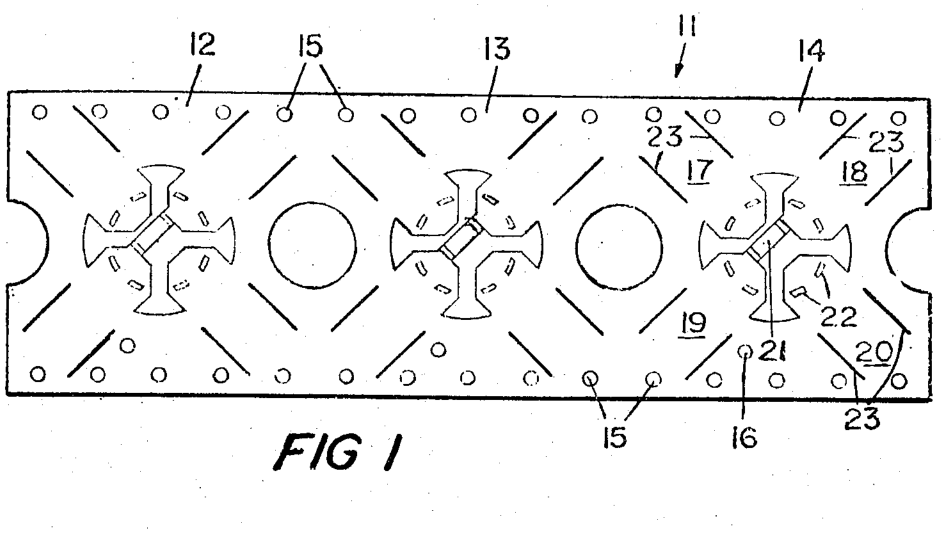
FIG. 1 is an enlarged plan view of one embodiment of the lead frame of the invention.

In FIG. 1, lead frame strip 11 is seen to include three identical sections, 12, 13, and 14. Three sections are illustrated for purposes of convenience only, since any number of sections, or a continuous strip containing multiple sections, may be used. Indexing holes 15 along the edge of strip 11 are provided for the purpose of precisely locating the strip with respect to processing equipment during the various stages of the process. The one additional indexing hole in each section, for example, hole 16 of section 14, is for the purpose of orientating the device after encapsulation in order to identify the emitter, base, and collector leads, respectively. Each section of the lead frame includes four inwardly projecting, substantially coplanar lead portions 17, 18, 19, and 20, and a bridging portion 21 integral therewith connecting the ends of lead portions 18 and 19. Openings 22 near each end of the lead portions improve the strength of the final plastic encapsulation body by permitting mechanical interconnection of the lower section of the plastic body with the upper section thereof. Slots 23 define the lines along which the lead frame member is trimmed to remove the excess material and to separate the lead portions.

Lead frame 11 is typically prepared by stamping or etching a sheet metal strip having a thickness of about 5 to 15 mils, made of copper, nickel, aluminum, or alloys thereof, such as the standard Kovar leads, well known in the semiconductor industry.

Figure 2:
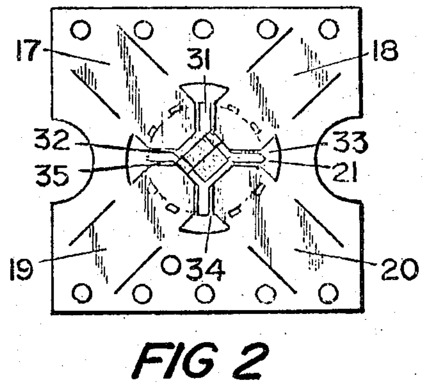
FIG. 2 is an enlarged plan view of one section of the lead frame of FIG. 1, bonded to a metallized ceramic base.

FIG. 2 illustrates the bonding of lead frame section 14, for example, to ceramic base member 31. This bonding operation is conveniently effected by brazing the lead ends to metallized areas 32, 33, 34, and 35 on the surface of ceramic disk 31. These metallized areas are patterned in accordance with known procedures, including, for example, moly-manganese metallization, covered with gold. It is also possible to metallize directly with gold, thereby avoiding the additional interface introduced by plural-layer metallization. However, a significant sacrifice im mechanical strength usually accompanies such direct metallization with gold.

It will be apparent that bridging portion 21 must be shaped to avoid electrical contact with metallized area 32 of ceramic disk 31. Such shaping is preferably completed on all sections of strip 11 prior to the bonding thereto of ceramic base members 31. Suitable means for stamping to provide the shaping of bridge portion 21 are readily provided by one skilled in the art of metal-working procedures.

Figure 3:
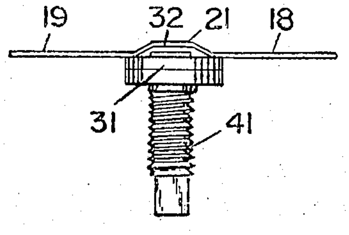
FIG. 3 is an enlarged elevation of a structure of FIG. 2 showing the attachment of a metallic stud member to the ceramic base.

In FIG. 3, a clearance between bridging portion 21 and metallized area 32 is apparent. The attachment of metallic stud member 41 to ceramic base 31 provides a heat sink member and also provides a convenient means for attaching the assembly to a chassis or other base for ultimate installation.

Figure 4:
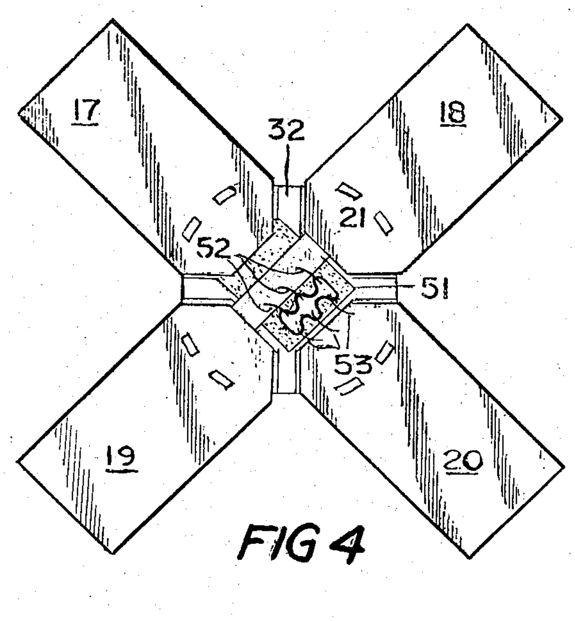
FIG. 4 is a plan view of the structure of FIG. 2 after die-bonding and wire-bonding operations to complete the electrical structure of the device.

FIG. 4 illustrates the die bonding of transistor 51 to metallized area 32 which may be effected with known bonding techniques. The emitter region of die 51 is connected to bridging portion 21 by means of conventional wire bonding operations to provide wires 52 of equal lengths. The base region is similarly connected to lead 20 by means of wires 53, thereby completing the electrical features of the assembly. Wires 52 and 53 are then protected by a precoating of liquid silicone resin such as Dow Corning 307, for example, in order to avoid or minimize the possibility of breakage during the final encapsulation step.

Figure 5:
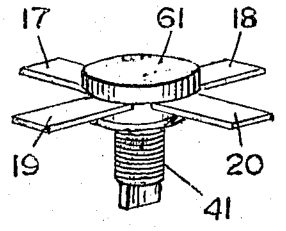
FIG. 5 is a perspective view of the completed assembly, after plastic encapsulation.

In FIG. 5 plastic body 61 has been added, for example, by a transfer molding operation, thereby completing the packaged transistor assembly. Actually, the final trimming operation should follow rather than precede the final encapsulation step.

I claim:

1. In a one-piece lead frame of a substantially flat electroconductive material having a plurality of sections over the length thereof with each section usable for the assembly of a semiconductor device, the combination in each section of said lead frame of an open central area, a plurality of lead portions spaced from one another and extending radially outwardly from said central area and defined in said material of the section by precutting the material, to define said plurality of lead portions with a pair of said lead portions having a portion of the lead frame material connecting the same with excess portions of the material adjacent to each lead portion remaining in the lead frame during assembly steps for the semiconductor device, with each said lead portion having an inner end portion and an outer end portion with the latter adapted for the outside connection from the semiconductor device, said connecting portion of the lead frame material comprising a self-supporting conductive bridging portion integral with and connecting pair of said lead portions at the inner end portion of each shaped so that the greater portion of said bridging portion is in a plane spaced axially away from the plane of said material through said central area, with each section of the lead frame adapted to have a semiconductor unit with electrodes on a face thereof mounted on an insulating base member at the opening in said central area, whereby a wire conductor can be extended from an electrode directly to said bridging portion in a short conductive connection to minimize the inductance of a circuit comprising the combination of such electrode, a conductor, the bridging portion, and the lead pair of portions integral with said bridging portion, with other lead portions in a lead frame section and said pair of lead portions being so constructed as to be mountable upon the insulating base member in the assembly of a semiconductor device for insulating separation of said pair of lead portions from said other lead portions, and all said lead portions and said excess portions of a section in the lead frame being separable relative to the material of the lead frame in the assembly of a semiconductor device.

2. A lead frame as defined in claim 1 wherein a bridging portion of a section is noncoplanar with respect to said plurality of lead portions in that section and is adapted to be out of direct physical contact with a semiconductor unit when such unit is mounted at the central area opening of said lead frame.

3. A lead frame as defined in claim 1 wherein the central area opening is of a size and shape adapted to receive an insulating base member at the opening upon which to mount a semiconductor unit.

4. A lead frame as defined in claim 1 wherein said lead portions connected by said bridging portion extend directly opposite to one another and are in the same plane.

5. A lead frame as defined in claim 1 wherein a lead portion has at least one aperture therein near its inner end adapted to have plastic flow therethrough during the plastic encapsulation of the semiconductor device.

6. A lead frame as defined in claim 1 wherein the precut lines in the material defining lead portions comprise terminated slots along which the radially extending lead portions and the material are separated in the assembly of a semiconductor device.

7. A lead frame as defined in claim 1 wherein the two lead portions to which the bridging portion is connected extend in opposite directions along a colinear central axis, and the bridging portion is narrower than each said lead portion and is offset from said control axis.

* * * * *

UNITED STATES PATENT OFFICE
CERTIFICATE OF CORRECTION

Patent No. 3,860,397 Dated January 14, 1974

Inventor(s) Eugene E. Segerson

It is certified that error appears in the above-identified patent and that said Letters Patent are hereby corrected as shown below:

Column 4, line 31, "im" should read -- in --.

Column 5, line 17, "pair of said" should read -- said pair of --.

Column 5, line 29, "lead pair of" should read -- pair of lead --.

Signed and sealed this 1st day of April 1975.

(SEAL)
Attest:

RUTH C. MASON
Attesting Officer

C. MARSHALL DANN
Commissioner of Patents
and Trademarks